United States Patent
Kawata (10) Patent No.: US 7,391,052 B2
(45) Date of Patent: Jun. 24, 2008

(54) TFT STRUCTURE FOR SUPPRESSING PARASITIC MOSFET IN ACTIVE DISPLAY

(75) Inventor: Hirotaka Kawata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 96 days.

(21) Appl. No.: 10/875,588

(22) Filed: Jun. 25, 2004

(65) Prior Publication Data

US 2004/0232425 A1 Nov. 25, 2004

Related U.S. Application Data

(62) Division of application No. 09/617,441, filed on Jul. 14, 2000, now Pat. No. 6,815,718.

(30) Foreign Application Priority Data

Jul. 16, 1999 (JP) .................................. 11-203630
Jun. 30, 2000 (JP) .............................. 2000-198616

(51) Int. Cl.
*H01L 29/04* (2006.01)
*H01L 31/036* (2006.01)
*H01L 31/0376* (2006.01)
*H01L 31/20* (2006.01)

(52) U.S. Cl. ..................... 257/59; 257/72; 257/E29.117; 257/E29.273

(58) Field of Classification Search ............ 257/58, 257/59, 66, 72, E29.117, E29.273; 438/149, 438/166; 349/42, 43

See application file for complete search history.

(56) References Cited

U.S. PATENT DOCUMENTS

| | | | |
|---|---|---|---|
| 5,316,960 A | 5/1994 | Watanabe et al. | |
| 5,374,564 A | 12/1994 | Bruel | |
| 5,412,493 A * | 5/1995 | Kunii et al. | 349/43 |
| 5,517,150 A * | 5/1996 | Okumura | 327/427 |
| 5,614,730 A | 3/1997 | Nakazawa et al. | |
| 5,650,636 A * | 7/1997 | Takemura et al. | 257/59 |
| 5,701,167 A * | 12/1997 | Yamazaki | 349/42 |
| 5,703,382 A | 12/1997 | Hack et al. | |
| 5,717,473 A * | 2/1998 | Miyawaki | 349/43 |
| 5,729,308 A * | 3/1998 | Yamazaki et al. | 349/39 |
| 5,748,165 A * | 5/1998 | Kubota et al. | 345/96 |
| 5,777,703 A * | 7/1998 | Nishikawa | 349/47 |
| 6,031,589 A | 2/2000 | Kim | |
| 6,066,860 A * | 5/2000 | Katayama et al. | 257/71 |
| 6,127,235 A | 10/2000 | Gardner et al. | |

(Continued)

FOREIGN PATENT DOCUMENTS

JP A-4-346418 12/1992

(Continued)

*Primary Examiner*—Hoai V Pham
(74) *Attorney, Agent, or Firm*—Oliff & Berridge, PLC (57) ABSTRACT

A TFT is provided completely separated by an insulating film, in which a parasitic MOSFET is not generated at ends of a semiconductor layer, and the variation in characteristics is small. At least one portion of the ends in the gate-width direction of a gate electrode forming the TFT is disposed in a semiconductor region which forms the TFT, and the ends in the gate-length direction of the gate electrode extend toward the outside of the semiconductor region forming the TFT. With this arrangement, a uniform TFT in which a parasitic MOSFET is not generated at the ends in the gate-width direction is obtainable.

8 Claims, 8 Drawing Sheetse

U.S. PATENT DOCUMENTS

| | | | | |
|---|---|---|---|---|
| 6,255,705 B1 * | 7/2001 | Zhang et al. | ............... | 257/412 |
| 6,297,518 B1 * | 10/2001 | Zhang | ................. | 257/59 |
| 6,306,213 B1 * | 10/2001 | Yamazaki | ................. | 117/95 |
| 6,330,044 B1 * | 12/2001 | Murade | ................. | 349/44 |
| 6,335,778 B1 * | 1/2002 | Kubota et al. | ............... | 349/151 |
| 6,417,896 B1 * | 7/2002 | Yamazaki et al. | ............. | 349/39 |
| 6,437,367 B1 * | 8/2002 | Yamazaki et al. | ............. | 257/59 |
| 6,504,215 B1 * | 1/2003 | Yamanaka et al. | ............ | 257/350 |
| 6,573,955 B2 | 6/2003 | Murade | | |
| 6,610,997 B2 * | 8/2003 | Murade | ................. | 257/72 |
| 6,744,198 B2 * | 6/2004 | Hirabayashi | ............... | 313/506 |
| 6,891,588 B2 * | 5/2005 | Kawachi et al. | ............. | 349/114 |
| 6,909,242 B2 * | 6/2005 | Kimura | ................. | 315/169.3 |
| 6,919,886 B2 * | 7/2005 | Sato et al. | ................. | 345/205 |
| 2002/0140643 A1 * | 10/2002 | Sato | ................. | 345/76 |
| 2003/0011584 A1 * | 1/2003 | Azami et al. | ............... | 345/204 |
| 2003/0094614 A1 * | 5/2003 | Yamazaki et al. | ............. | 257/72 |

FOREIGN PATENT DOCUMENTS

| | | |
|---|---|---|
| JP | A 05-088200 | 4/1993 |
| JP | 6163891 | 6/1994 |
| JP | A 07-066419 | 3/1995 |
| JP | A 07-092493 | 4/1995 |
| JP | A 08-116063 | 5/1996 |
| JP | A-9-246563 | 9/1997 |
| JP | A 10-301100 | 11/1998 |
| WO | WO 9816868 A1 | 4/1998 |
| WO | WO99/35678 A1 | 7/1999 |

* cited by examiner

TFT STRUCTURE FOR SUPPRESSING PARASITIC MOSFET IN ACTIVE DISPLAY

This is a Divisional of application Ser. No. 09/617,441 filed Jul. 14, 2000, now U.S. Pat. No. 6,815,718. The entire disclosure of the prior application is hereby incorporated by reference herein in its entirety.

BACKGROUND OF THE INVENTION

1. Field of Invention

The present invention relates to electro-optical devices provided with semiconductor layers formed on substrates, and to electronic equipment using the same. In particular, the present invention relates to an electro-optical device in which each gate-electrode provided on a semiconductor layer extends in the longitudinal direction of a gate so that the ends of the gate electrode are disposed outside the semiconductor layer. The invention also relates to an electronic equipment using the electro-optical device.

2. Description of Related Art

Hitherto, an SOI technology for depositing a thin silicon film on an insulative substance, and forming a semiconductor device on the thin silicon film has been widely studied because the technology contributes to elements having increased speed, reduced power consumption, greater levels of integration, and the like.

An SOI technology is a technology for manufacturing an SOI substrate by bonding monocrystalline-silicon substrates. This technology, generally called a bonding method, is a method for bonding a monocrystalline-silicon substrate with a supporting substrate by using a hydrogen bonding force, reinforcing the bonding force by heat treatment, and grinding and polishing the monocrystalline-silicon substrate; or a method for forming a thin monocrystalline-silicon layer on a supporting substrate by etching. By this method, in which a thin film is made directly from a monocrystalline-silicon substrate, a highly efficient device having superior crystallinity in the thin silicon film is obtainable.

Other methods using the bonding method are known. In one method, a monocrystalline-silicon substrate is doped with hydrogen ion, the monocrystalline-silicon substrate is bonded to a supporting substrate, and a thin silicon layer is separated from a hydrogen-doped region of the monocrystalline-silicon substrate by heat treatment (U.S. Pat. No. 5,374, 564). In another method, a monocrystalline-silicon layer is epitaxially grown on a porous surface of a silicon substrate, the silicon substrate is bonded to a supporting substrate, then the silicon substrate is removed, and the porous silicon layer is etched, thereby forming an epitaxial monocrystalline thin silicon film on the supporting substrate (Japanese Unexamined Patent Application Publication No. 4-346418). SOI substrates manufactured by these bonding methods are used for various devices in the same way as conventional bulk semiconductor substrates. A feature of the SOI substrates which is different from that of the conventional bulk substrates is that different types of material can be used for the supporting substrates. Transparent quartz and glass substrates other than conventional silicon substrates can be used. By forming a thin monocrystalline-silicon film on the transparent substrate, a highly efficient transistor element can be provided by using monocrystalline silicon having superior crystallinity for a device which requires light transmissibility, such as a light-transmissive liquid crystal display device.

In a MOSFET (metal oxide semiconductor field effect transistor) element on a conventional silicon substrate, a parasitic MOSFET is prevented from being driven by setting the concentration of impurity in a region under a field oxide film (so-called LOCOS), which separates a MOSFET region, to a concentration higher than that in the well.

SUMMARY OF THE INVENTION

In an electro-optical device such as a liquid crystal device, each transistor element which constitutes a switching unit of, for example, a TFT array is completely separated by an oxide insulating film. In this case, a parasitic MOSFET is produced at an edge of a semiconductor layer forming the transistor element, as shown in FIG. 4 and FIG. 5.

Figure 4:
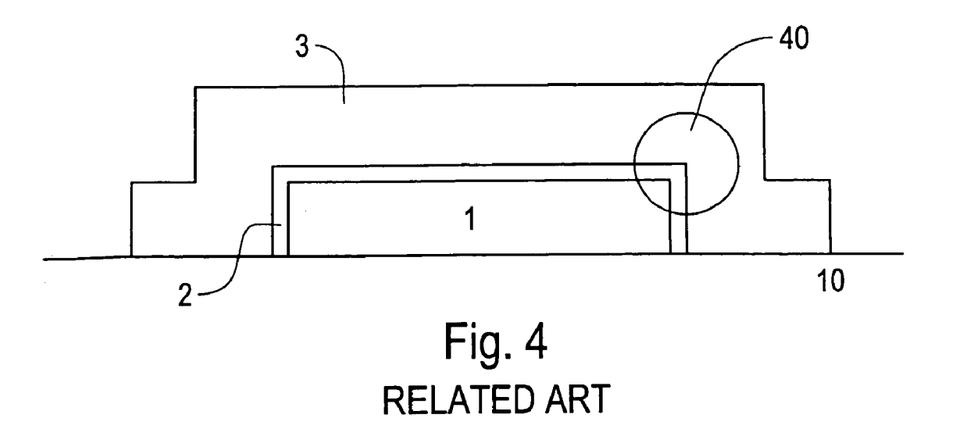
FIG. 4 is a sectional view in the gate width direction of a conventional mesa-etched TFT.

FIG. 4 is a sectional view of a TFT in the gate-width direction, in which a so-called mesa-etching method is used for separating a semiconductor layer. A gate oxide film 2 is formed on a semiconductor layer 1 which is mesa-etched. The gate oxide film 2 is provided with a gate electrode 3 formed thereon. In the above-described configuration, an electric field is concentrated to a shoulder 40, shown by the circle in FIG. □4, of an edge of the semiconductor layer□1. Therefore, a parasitic MOSFET in this part has a threshold lower than the desired threshold. In order to suppress the parasitic MOSFET, dopant concentration in the shoulder 40 of the edge of the semiconductor layer□1 has been hitherto increased.

Figure 5:
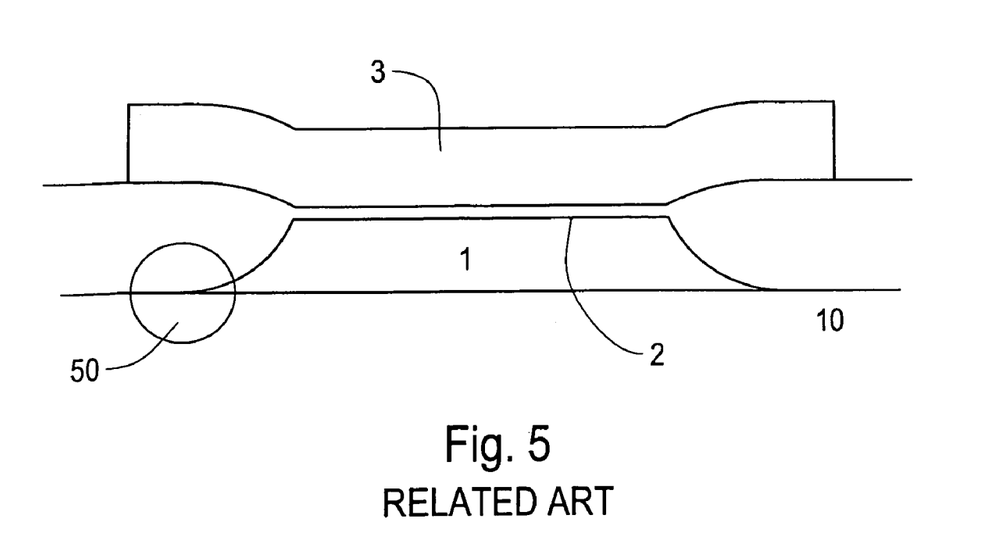
FIG. 5 is a sectional view in the gate width direction of a conventional LOCOS-separated TFT.

FIG. 5 is a sectional view of a TFT in the gate-width direction, in which a so-called LOCOS separation method is used for separating a semiconductor layer. When the gate electrode 3 is formed by gate-oxidizing the semiconductor layer 1 separated by LOCOS separation, the film thickness at an edge 50, shown by the circle in FIG. □5, of the semiconductor layer 1 is reduced. Therefore, the parasitic MOSFET in this part has a threshold lower than the desired threshold. In order to suppress the parasitic MOSFET, dopant concentration in the edge 50 of the semiconductor layer 1 has been hitherto increased.

As described above, the parasitic MOSFET at an edge of the semiconductor layer constituting the transistor element can be prevented from being produced by increasing the dopant concentration in that part. Generally, it is necessary to select doping regions by a photolithographic process for forming regions in which the dopant concentration is high. In order to activate the implanted dopant, an annealing process is needed. In the annealing process, the implanted dopant is diffused. The above-described regions in which the dopant concentration is increased are determined by two factors, which are the accuracy in the photolithographic process and the extent of the diffusion of the dopant.

However, it is difficult to accurately form regions in which the dopant concentration is increased. Because the region in which the dopant concentration is increased determines the width of a transistor, when transistor elements thus formed are used for switching elements of a liquid crystal and the like, there is a risk of causing variation in the performance of each element and irregularity in display.

Accordingly, an exemplary object of the present invention is to at least provide an electro-optical device and an electronic equipment using the same, in which transistor elements, each formed with a semiconductor layer laminated with an insulating film, are prevented from malfunctioning due to a parasitic MOSFET, and the electrical characteristic of each element can be uniform.

An electro-optical device according to an exemplary embodiment of the present invention preferably consists of: a substrate; a plurality of scanning lines provided on the substrate; a plurality of data lines crossing the plurality of scanning lines; a plurality of transistors formed with gate electrodes having ends in a gate-width direction and ends in a gate-length direction, each transistor being connected to one of the scanning lines and one of the data lines; and pixel electrodes connected to the transistors. In the electro-optical device of this exemplary embodiment, at least one portion of the ends in the gate-width direction of each of the gate electrodes forming the transistors is disposed in a semiconductor region forming the transistor, and the ends in the gate-length direction of each of the gate electrodes extend outside of the semiconductor region forming the transistor.

With this arrangement according to this exemplary embodiment of the present invention, a parasitic MOSFET may be suppressed by providing the gate electrodes at the ends of each channel region of the semiconductor layer. By extending the ends in the gate-length direction of the gate electrodes, the gate electrodes may be easily separated from the source-drain regions. The gate width of each transistor may be set only by etching of the gate electrode, thereby suppressing variation between each transistor in the gate width.

In the electro-optical device according to this exemplary embodiment of the present invention, a semiconductor layer forming the transistor may include monocrystalline silicon.

With this arrangement according to this exemplary embodiment of the present invention, elements having superior performance may be manufactured by making the semiconductor layer from monocrystalline silicon.

In the electro-optical device according to this exemplary embodiment of the present invention, the semiconductor layer forming the transistor may include polycrystalline silicon.

With this arrangement according to this exemplary embodiment of the present invention, the electro-optical device may be manufactured at a low cost.

In the electro-optical device according to this exemplary embodiment of the present invention, the substrate may be made of an insulative substance. With this arrangement according to this exemplary embodiment of the present invention, a transparent may be used, whereby the substrate may be used for an electro-optical device which requires light-transmissibility.

In the electro-optical device according to this exemplary embodiment of the present invention, the substrate may be a quartz substrate. With this arrangement according to this exemplary embodiment of the present invention, high-temperature processes of not less than 1000° C. may be applied by using the quartz substrate, whereby elements having superior performance may be manufactured.

In the electro-optical device according to this exemplary embodiment of the present invention, the substrate may be a glass substrate.

With this arrangement according to this exemplary embodiment of the present invention, elements may be formed on a substrate having a large area by using the glass substrate, thereby reducing manufacturing cost of the electro-optical device.

An electro-optical device according to another exemplary embodiment of the present invention preferably consists of: a substrate; a plurality of scanning lines provided on the substrate; a plurality of data lines crossing the plurality of scanning lines; a plurality of transistors formed with gate electrodes having ends in a gate-width direction and ends in a gate-length direction, each transistor being connected to one of the scanning lines and one of the data lines; and pixel electrodes connected to the transistors. In the electro-optical device of this exemplary embodiment, at least one portion of the ends in the gate-width direction of each of the gate electrodes forming the transistors is disposed in a semiconductor region forming the transistor, the ends in the gate-length direction of each of the gate electrodes extend toward the outside of the semiconductor region forming the transistor, and at least one of the ends in the gate-width direction of a channel region of each transistor is electrically connectable.

With this arrangement according to this exemplary embodiment of the present invention, a so-called stray effect in the substrate may be suppressed by electrically connecting the channel regions of the transistors, whereby an electro-optical device having high potential-resistance between the source and drain may be provided.

In the electro-optical device according to this exemplary embodiment of the present invention, a line to be electrically connected to the channel region of each transistor may be a capacitance line.

With this arrangement according to this exemplary embodiment of the present invention, it is not necessary to prepare particular wires for electrical connection of the channel regions of the transistors. The aperture ratio in a light-transmissive electro-optical device may be increased, and an electro-optical device having high brightness may be manufactured.

In the electro-optical device according to this exemplary embodiment of the present invention, the transistors may be P-channel transistors for supplying ground potential to the capacitance lines electrically connected to the channel regions of the P-channel transistors.

With this arrangement according to this exemplary embodiment of the present invention, the potential-resistance between the source and drain of each of the P-channel transistors may be increased by supplying ground potential to the channel regions of the P-channel transistors. It is not necessary to provide additional potential because the electric potential to be supplied is ground potential.

In the electro-optical device according to this exemplary embodiment of the present invention, the transistors may be N-channel transistors for supplying ground potential to the capacitance lines electrically connected to the channel regions of the N-channel transistors.

With this arrangement according to this exemplary embodiment of the present invention, the potential-resistance between the source and drain of each of the N-channel transistors may be increased by supplying ground potential to the channel regions of the N-channel transistors. It is not necessary to provide additional potential because the electric potential to be supplied is ground potential.

In the electro-optical device according to this exemplary embodiment of the present invention, a semiconductor layer forming the transistor may include monocrystalline silicon.

With this arrangement according to this exemplary embodiment of the present invention, elements having superior performance may be manufactured.

In the electro-optical device according to this exemplary embodiment of the present invention, the semiconductor layer forming the transistor may include polycrystalline silicon.

With this arrangement according to this exemplary embodiment the present invention, the manufacturing cost of the electro-optical device may be reduced.

In the electro-optical device according to this exemplary embodiment of the present invention, the substrate may be made of an insulative substance.

With this arrangement according to this exemplary embodiment of the present invention, a transparent substrate can be used, whereby the substrate may be used for an electro-optical device which requires light-transmissibility.

In the electro-optical device according to this exemplary embodiment of the present invention, the substrate may be a quartz substrate.

With this arrangement according to this exemplary embodiment of the present invention, high-temperature processes of not less than 1000° C. may be applied by using the quartz substrate, whereby elements having superior performance may be manufactured.

In the electro-optical device according to this exemplary embodiment of the present invention, the substrate may be a glass substrate.

With this arrangement according to this exemplary embodiment the present invention, elements may be formed on a substrate having a large area by using the glass substrate, thereby at least reducing manufacturing cost of the electro-optical device.

The electro-optical device according to this exemplary embodiment of the present invention may further include another substrate disposed opposing the surface of the substrate provided with the semiconductor layers, and liquid crystals sandwiched by the two substrates and driven by transistor elements formed on the semiconductor layers.

According to yet another exemplary embodiment of the present invention, an electronic equipment preferably consists of a light source, the above-described electro-optical device for modulating, in accordance with image information, incident light emitted by the light source, and a projection medium for projecting the light modulated by the electro-optical device.

DETAILED DESCRIPTION OF PREFERRED EMBODIMENTS

Preferred embodiments of the present invention are described below with reference to the drawings.

Figure 1:
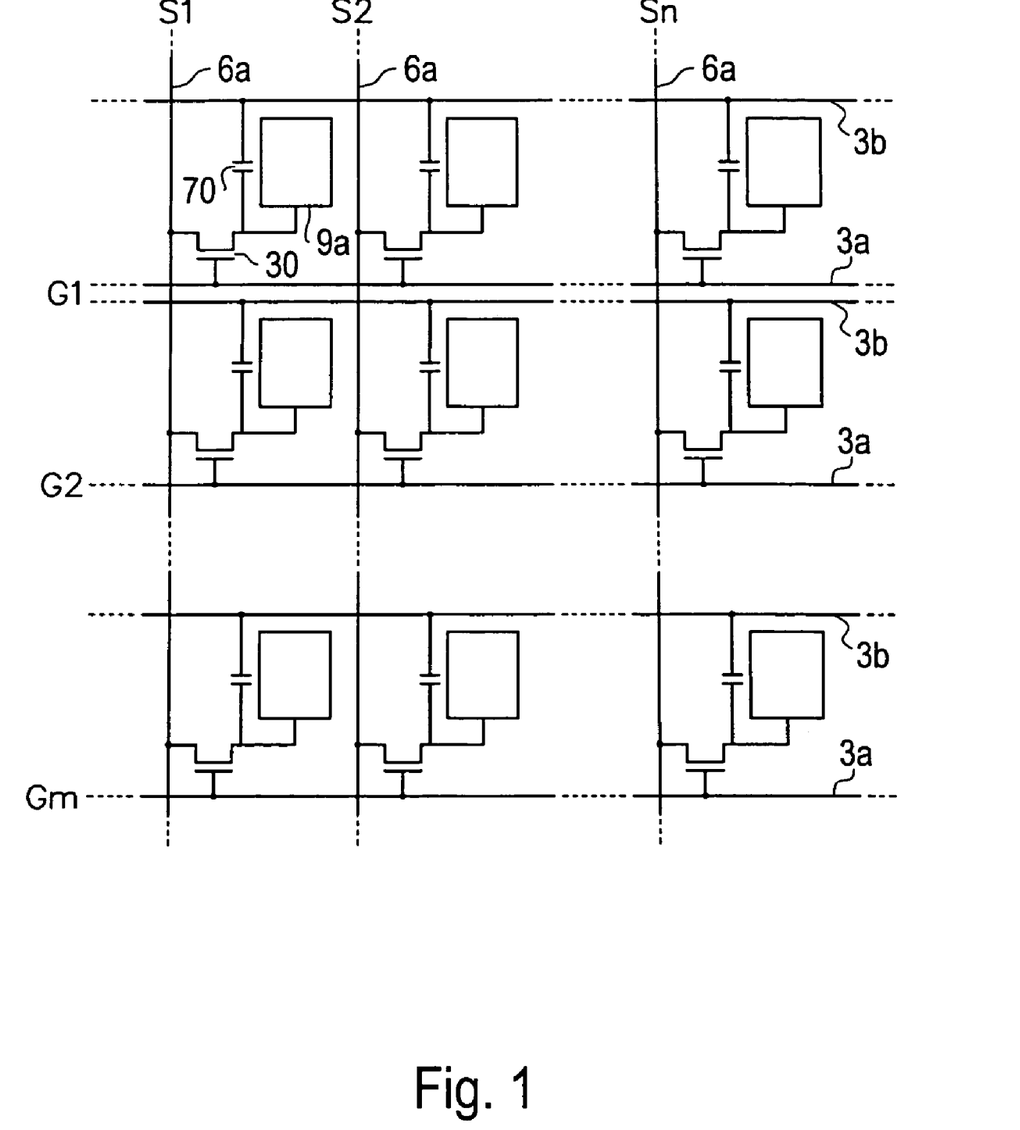
FIG. 1 is a block diagram of an equivalent circuit including a plurality of pixels in a matrix forming an image forming region of a liquid crystal device according to an exemplary embodiment of the present invention.

Description of the Configuration of a Substrate of a Liquid Crystal Panel According to an Embodiment FIG. 1 is a block diagram of an equivalent circuit including various elements, wires, and the like according to an exemplary embodiment of the present invention. The various elements, wires and the like are included in a plurality of pixels formed in a matrix to provide an image forming region of a liquid crystal device as an electro-optical device.

Referring to FIG. 1, a plurality of pixels are formed in a matrix to provide an image forming region of a liquid crystal device, according to an exemplary embodiment of the present embodiment. The plurality of pixels include a plurality of pixel electrodes 9a formed in matrices, and TFTs 30 which are transistors for controlling the pixel electrodes 9a. Data lines 6a for outputting image signals are electrically connected to sources of the respective TFTs 30. Image signals S1, S2, . . . , Sn to be written in the data lines 6a may be outputted in this order, and may be outputted to each group consisting of a plurality of the adjacent data lines 6a. Scanning lines 3a are electrically connected to the gates of the TFTs 30. Scanning signals G1, G2, . . . , Gm are applied in pulses to the scanning lines 3a in this order, at a predetermined timing. The pixel electrodes 9a are electrically connected to drains of the TFTs 30. The pixel electrodes 9a write the image signals S1, S2, . . . , Sn outputted by the data lines 6a at a predetermined timing by closing switches of the TFTs 30, which are switching elements, for a set period. The image signals S1, S2, . . . , Sn of a predetermined level written on liquid crystals through the pixel electrodes 9a are maintained for a set period between the pixel electrodes 9a and opposing electrodes (described below) formed on an opposing substrate (described below). In order to prevent leakage of the maintained image signals, storage capacitances 70 are formed parallel to liquid crystal capacitance formed between the pixel electrodes 9a and the opposing electrodes. With this arrangement, maintenance characteristics are further improved, whereby a liquid crystal device having high contrast is possible. According to the present embodiment, low-resistance capacitance lines 3b are provided by using either the same layer as the scanning lines or a conductive light-shielding layer so as to form the storage capacitors 70.

Figure 2:
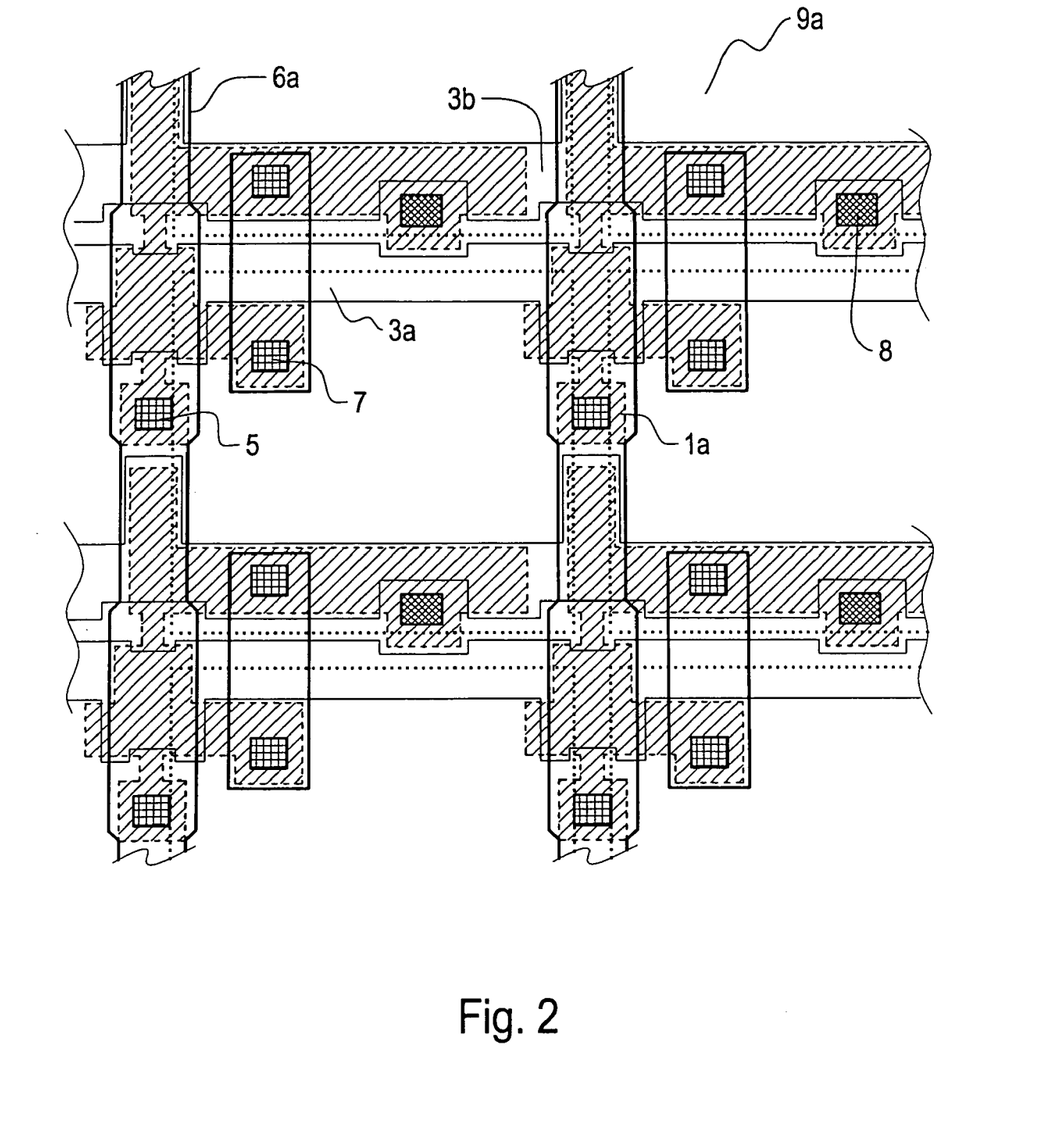
FIG. 2 is a plan view of a plurality of the adjacent pixels on a TFT-array substrate, according to the exemplary embodiment, on which the data lines, scanning lines, pixel electrodes, and the like are formed.

FIG. 2 is a plan view of a plurality of adjacent pixels on a TFT-array substrate on which data lines, scanning lines, pixel electrodes, light-shielding layers, and the like are formed. In FIG. 2, a plurality of transparent pixel electrodes 9a (the outlines are shown by dotted lines) disposed in a matrix are provided on a TFT-array substrate of a liquid crystal device. The data lines 6a, the scanning lines 3a, and the capacitance lines 3b are disposed along the vertical and horizontal boundaries between each pixel electrode 9a.

The data lines 6a are electrically connected through contact holes 5 to source regions of semiconductor layers 1a of monocrystalline silicon described below. The pixel electrodes 9a are electrically connected through contact holes 8 to drain regions of the semiconductor layers 1a described below. The scanning lines 3a are disposed so as to oppose channel regions of the semiconductor layers 1a. The scanning lines 3a function as gate electrodes. Thus, the scanning line includes main portions and gate electrodes 3.

The capacitance lines 3b have main line portions extending substantially in a line along the scanning lines 3a (first portions formed along the scanning lines 3a when viewed in plan), and protruding portions (second portions extending along the data lines 6a when viewed in plan) protruding along the data lines 6a from the intersections with the data lines 6a toward the preceding pixel (upward in the drawing).

Referring to FIG. 2, a plurality of first light-shielding films are provided under the regions forming the semiconductor layers 1a, which are not shown in the drawing. More particularly, each of the first light-shielding films is disposed in a position of a pixel portion which covers, from the side of the TFT-array substrate, the TFT including the channel region of the semiconductor layer 1a. The first light-shielding films include main line portions extending in a line opposing the main line portions of the capacitance lines 3b and along the scanning lines 3a, and protruding portions protruding along the data lines 6a from the intersections with the data lines 6a toward the adjacent pixel (downward in the drawing). The ends of the downwardly protruding portions of the first light-shielding films at each pixel (at each row) overlap the ends of the upwardly protruding portions, along the data lines 6a, of the capacitance lines 3b disposed in the subsequent pixel.

Figure 3:
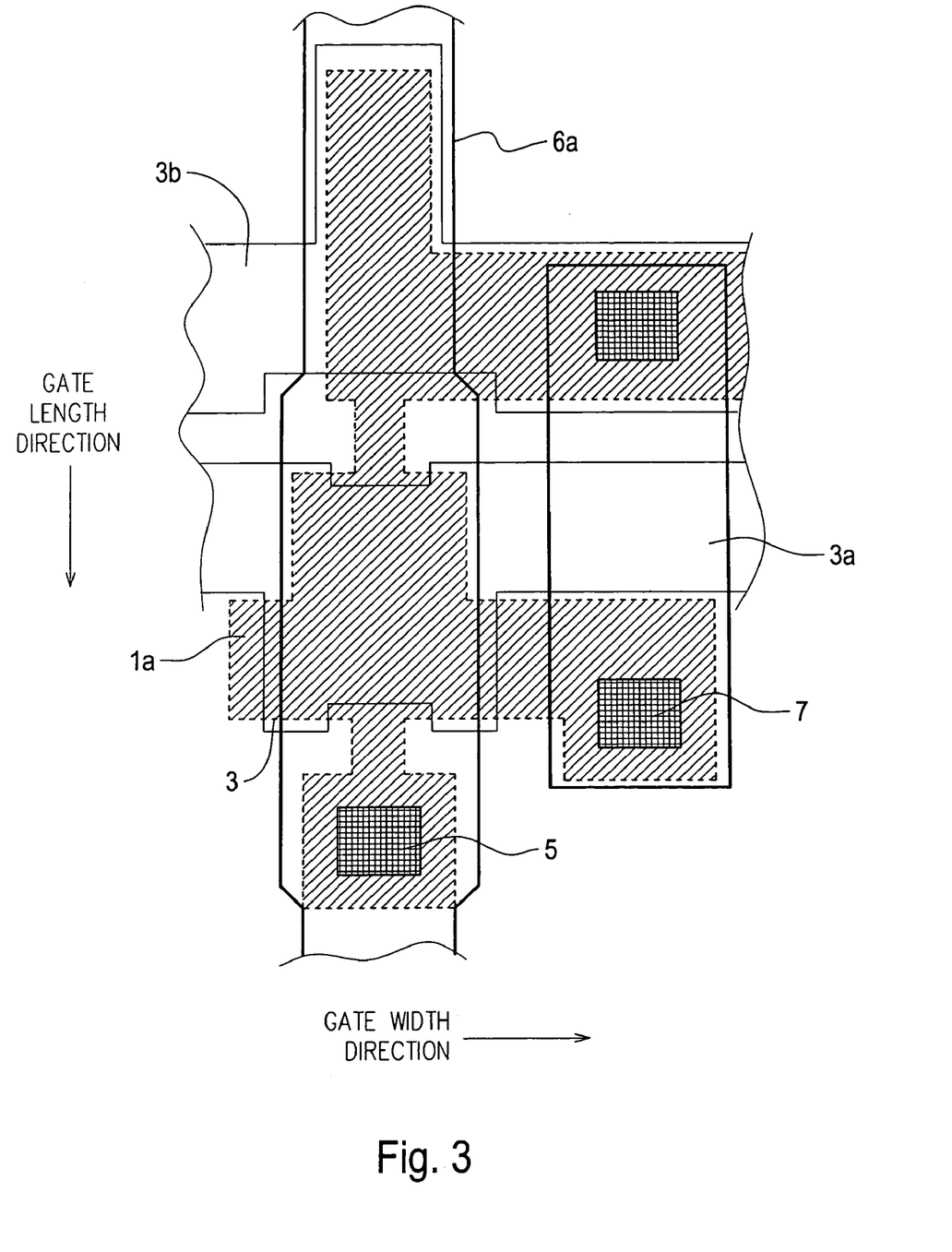
FIG. 3 is an expanded plan view of the TFT-array shown in FIG. 2.

FIG. 3 is an expanded plan view of the TFT shown in FIG. 2. In FIG. 3, the gate-length direction is a direction in which the data line 6a extends longitudinally/lengthwise, and the gate-width direction is a direction perpendicular to the gate-length direction. Each semiconductor layer 1a is electrically separated completely from the other semiconductor layers by a mesa-etching method, LOCOS method, or the like. The gate electrode 3 is provided on the semiconductor layer 1a through an insulating film. At least one portion of the ends of each gate electrode 3 is disposed on the semiconductor layer at least in an intersection between the data line 6a and the scanning line 3a where the data line 6a crosses the scanning line 3a, and is disposed within the data line 6a, as in a conventional TFT. At least one portion of the ends of the gate electrode 3 extend outside of the channel region of the semiconductor layer 1a, outside of the semiconductor layer 1a and outside of the data line 6a. A contact hole 7 for connection to the capacitance line 3b is provided on at least one of the ends of the semiconductor layer 1a extending toward the outside of the gate electrode 3.

According to this exemplary embodiment of the present invention, a parasitic MOSFET is suppressed by providing the gate electrodes at the ends of each channel region of the semiconductor layer 1a. By extending the ends of the gate electrodes in the gate-length direction, the gate electrodes can be easily separated from the source-drain regions. The gate width of each transistor can be set only by etching of the gate electrodes, thereby suppressing variation between each transistor in the gate width.

The electric potential at the channel regions of the TFTs can be stabilized. Therefore, a high source-drain voltage can be used without generating a stray effect in the substrate.

In the present embodiment, the supporting substrate is preferably a quartz substrate or a glass substrate. The pixel transistor may be N-type or P-type. When an N-type transistor is applied, ground potential is supplied to the semiconductor layer 1a via the capacitance line 3b. When a P-type transistor is applied, electric potential is supplied to the semiconductor layer 1a in the same manner. Furthermore, the semiconductor layer 1a can be applied by both monocrystalline silicon and polycrystalline silicon.

Figure 9:
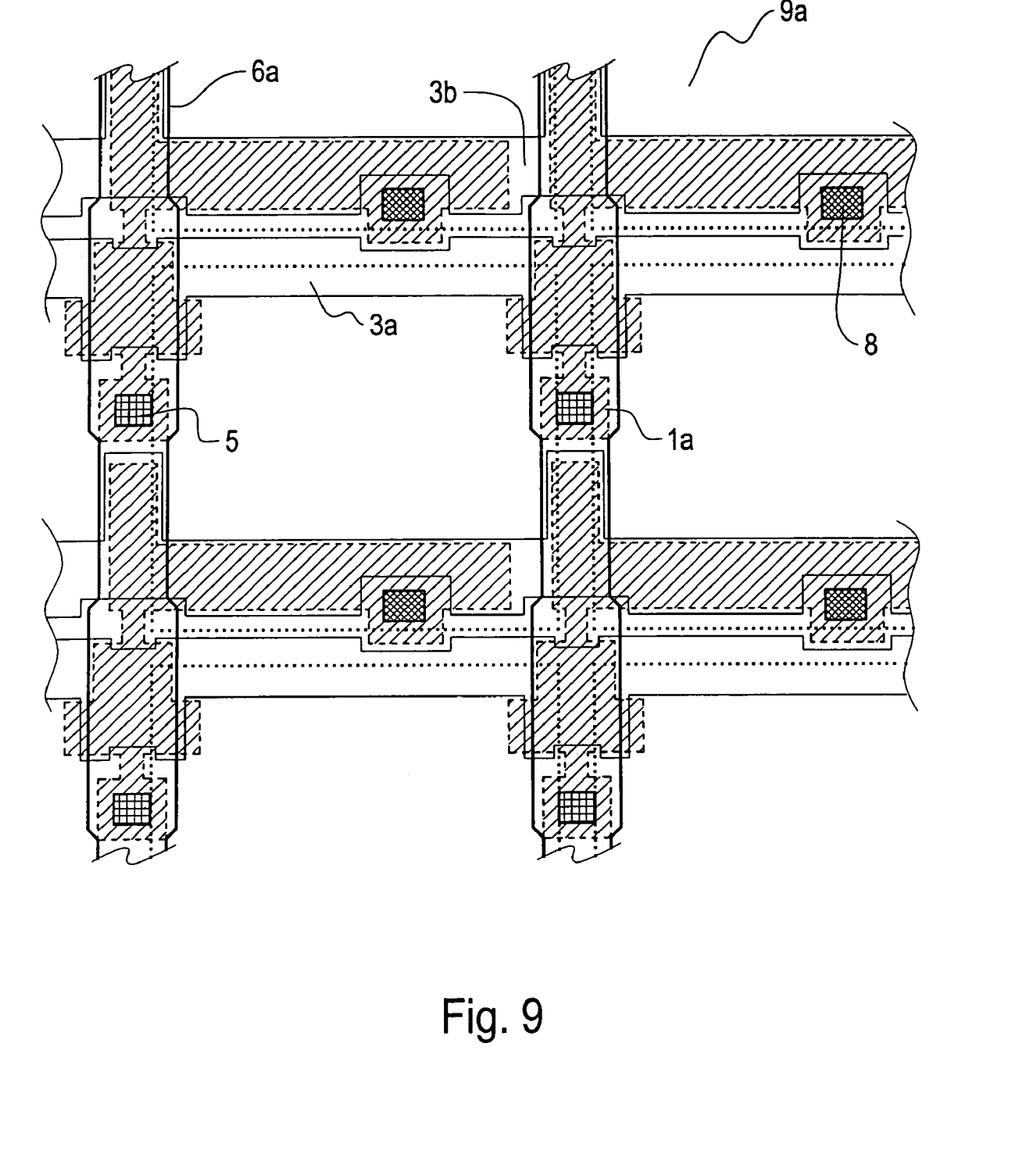
FIG. 9 is a plan view of a plurality of the adjacent pixels on a TFT-array substrate, according to another exemplary embodiment, on which the data lines, scanning lines, pixel electrodes, and the like are formed.
Figure 10:
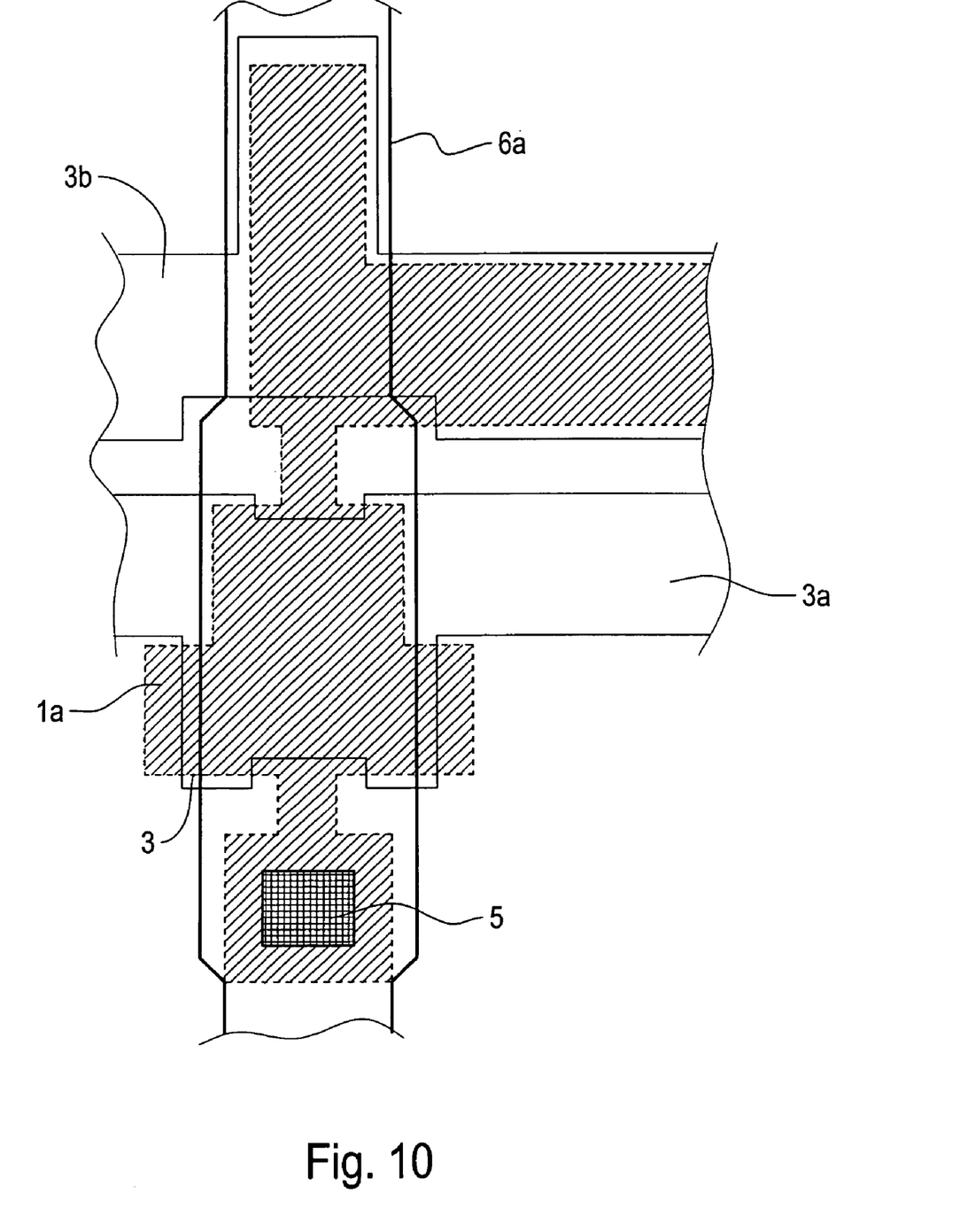
FIG. 10 is an expanded plan view of the TFT-array shown in FIG. 10.

In the TFT structure described above, the semiconductor layer 1a and the capacitance line 3b are connected with each other, however, a structure in which no connection portion is formed is also applicable. FIGS. 9 and 10 show an exemplary structure in which no connection portion is formed. FIG. 9 is a plan view of a plurality of adjacent pixels on a TFT-array substrate on which the data lines, the scanning lines, the pixel electrodes and the line are formed, and FIG. 10 is an enlarged plan view of the TFT-array portion of FIG. 9. The difference between the structure of FIG. 9 and FIG. 10 and the structure of FIG. 2 and FIG. 3 is the presence of the connection portion, and other features of the structures are the same.

(Overall Configuration of Liquid Crystal Device)

Figure 6:
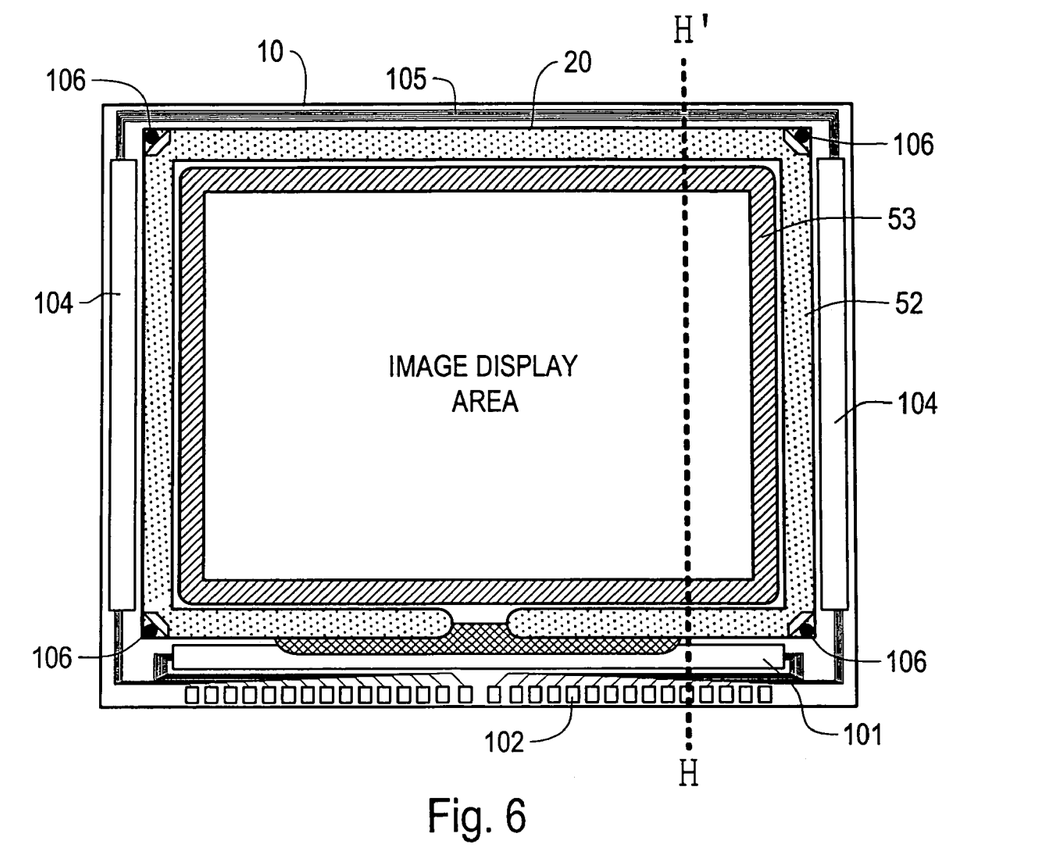
FIG. 6 is a plan view of a TFT-array substrate, according to the exemplary embodiment, provided with components formed thereon and used in a liquid crystal device, viewed from an opposing substrate side.
Figure 7:
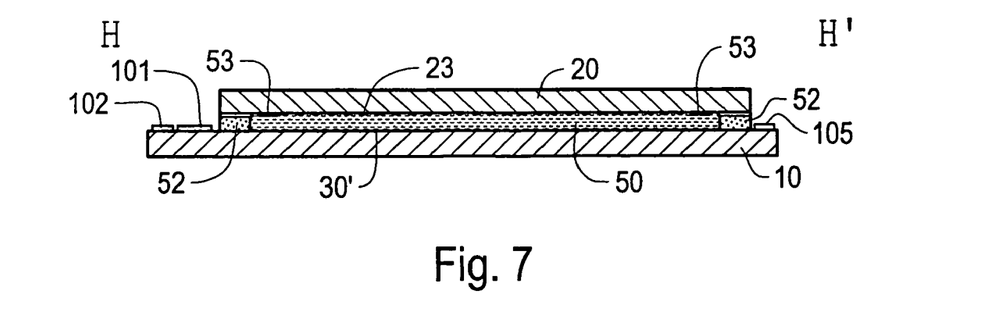
FIG. 7 is a sectional view, along a line VII-VII', of the TFT-array substrate shown in FIG. 6.

The overall configuration of the liquid crystal device described above, according to the exemplary embodiment, is described below with reference to FIG. 6 and FIG. 7. FIG. 6 is a plan view, from an opposing substrate 20 side, of a TFT-array substrate 10 provided thereon with components. FIG. 7 is a sectional view, along a line VII-VII', of the TFT-array substrate 10 including the opposing substrate 20 shown in FIG. 6.

As shown in FIG. 6 and FIG. 7, the TFT-array substrate 10 is provided with a sealing material 52 thereon along the sides of the TFT-array substrate 10. A second light-shielding film 53 is provided inside the sealing material 52 in parallel thereto. A third light-shielding film 23 is provided inside the second light-shielding film 53. The material of the second light-shielding film 53 may be, for example, the same as or different from the material of a the third light-shielding film 23.

A data-line driving circuit 101 and mounting terminals 102 are provided along one side of the TFT-array substrate 10 in a region outside the sealing material 52, and scanning line driving circuits 104 are provided along two sides of the TFT-array substrate 10 adjacent to this side. The scanning line driving circuit 104 may be provided only along one side, when scanning signals to be supplied to the scanning lines 3a do not delay.

The data-line driving circuits 101 may be disposed along two sides of an image display region. For example, one of the data-line driving circuits 101 disposed along one side of the image display region may supply image signals to the data lines 6a disposed on the odd-number columns, and the other data-line driving circuit 101 disposed the opposite side of the image display region may supply image signals to the data lines 6a disposed on the even-number columns. By thus driving the data lines 6a in a comb-shaped way, the area occupied by the data-line driving circuits can be increased, thereby enabling complex circuits.

A plurality of lines 105 are provided at the remaining side of the TFT-array substrate 10 for connecting the scanning line driving circuits 104 disposed at the two sides of the image display region. A conductive material 106 is provided at least at one of the corners of the opposing substrate 20, the conductive material 106 being for electrically connecting the TFT-array substrate 10 to the opposing substrate 20. As shown in FIG. 7, the opposing substrate 20 having substantially the same outline as that of the sealing material 52 is fixed to the TFT-array substrate 10 by the sealing material 52.

An inspection circuit for inspecting quality, defects, and the like of the liquid crystal device during manufacturing and shipping may be provided on the TFT-array substrate 10 of the liquid crystal device. Instead of providing the data-line driving circuit 101 and the scanning line driving circuits 104 on the TFT-array substrate 10, a driving LSI mounted on a TAB (tape automated bonding substrate) may be used for electric and mechanical connection through an anisotropically conductive film. Polarizing films, phase-contrast films and polarizing units are disposed in predetermined directions at each of the incident-light side of the opposing substrate 20 and the light-emission side of the TFT-array substrate 10, in accordance with a normally-white mode or normally-black mode, and operational modes, such as a TN (twisted nematic) mode, an STN (super TN) mode, and a D-STN (dual scan STN) mode.

When the above-described liquid crystal device is used, for example, for a color liquid crystal projector (projection display apparatus), three liquid crystal devices are used as light valves for RGB, in which colored light rays decomposed by dichroic mirrors for separating light to the colors R, G, and B are applied to each panel as projection light rays. In this case, color filters are not provided on the opposing substrate 20, as shown in the above-described embodiment. However, color filters having protection films for RGB may be formed on the opposing substrate 20 at a predetermined position thereof opposing the pixel electrodes 9*a* on which the third light-shielding film 23 is not provided. With this arrangement, the liquid crystal device according to the embodiments can be used for a color liquid crystal device, other than the liquid crystal projector, such as a direct-view-type or a reflective color liquid crystal television.

A microlens corresponding to each pixel may be formed on the opposing substrate. With this arrangement, a bright liquid crystal device can be realized by increasing the efficiency in condensation of incident light. Dichroic filters may be disposed on the opposing substrate 20, the dichroic filters being used to provide the colors R, G, and B by using light interference generated by a plurality of deposited interference layers having different refractive indexes. A brighter color liquid crystal device is possible by using the opposing substrate including the dichroic filters.

In the liquid crystal device according to the exemplary embodiments described above, the incident light is applied from the side of the opposing substrate 20, as in a conventional device. However, the incident light may be applied from the side of the TFT-array substrate 10 and emitted from the side of the opposing substrate 20. When the liquid crystal device is mounted on a liquid crystal projector, the channel region and LDD region of a semiconductor layer 1*a* can be prevented from receiving light, whereby images having high image quality can be displayed. Hitherto, a polarizing unit coated with an AR (anti-reflection) film must be additionally disposed or the AR film must be bonded in order to avoid reflection at the back side of the TFT-array substrate 10. On the other hand, according to the exemplary embodiments, the first light-shielding films are formed on the front surface of the TFT-array substrate 10 and on each semiconductor 1*a* at least between the channel region and the LDD region, whereby it is not necessary to use an AR-coated polarizing unit or an AR film, or use an AR-processed substrate for the TFT-array substrate 10. Therefore, the exemplary embodiments of the present invention offer advantages at least in which the material cost can be reduced, and the reduction of yield ratio due to dusts, scratches, and the like, which the device is likely to receive when mounting the polarizing unit, can be avoided. The liquid crystal device according to the exemplary embodiments has at least superior light-stability, whereby image deterioration due to the light, such as cross talk, does not occur when a light source having high luminosity is used, or light-utilization efficiency is increased by polarizing/converting through a polarizing beam splitter.

(Electronic Equipment)

Figure 8:
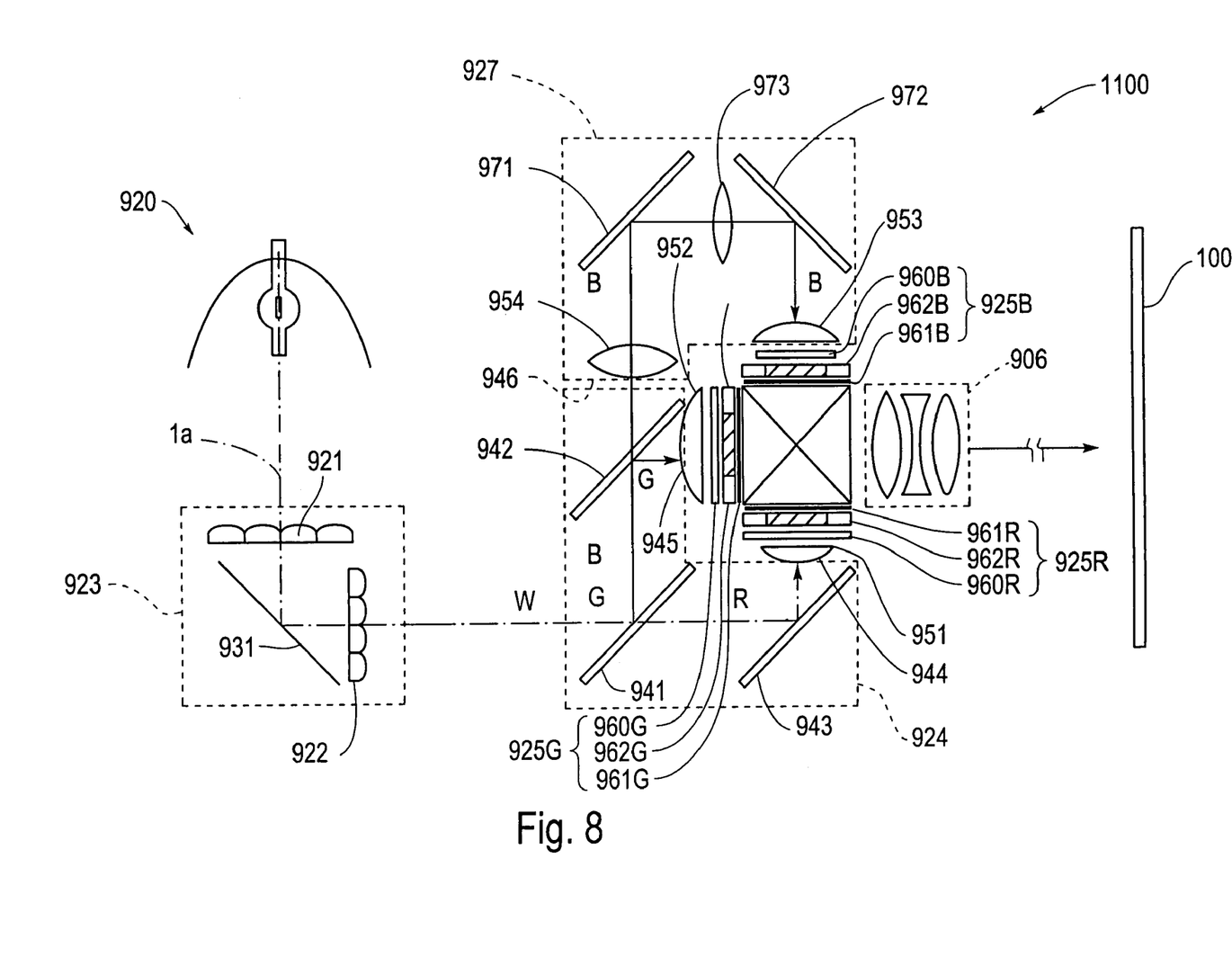
FIG. 8 is a block diagram of a projection display apparatus as an example of an electronic equipment using the liquid crystal device.

The following is a description referring to FIG. 8 for the configuration of a projection display apparatus as an example of an electronic equipment using the above-described liquid crystal device. FIG. 8 is a schematic diagram of an optical system of a projection display apparatus 1100 including three liquid crystal devices described above which are liquid crystal devices 962R, 962G, and 962B for colors R, G, and B, respectively. In the optical system of the projection display apparatus 1100 according to this exemplary embodiment, a light source device 920, as described above, and an uniform illumination optical system 923 are used. The projection display apparatus includes a color separation optical system 924 as a colored-light separating unit for splitting light W into red (R), green (G), and blue (B), three light valves 925R, 925G, and 925B as a modulating unit for modulating colored light beams R, G, and B, a color synthesizing prism 910 as a color synthesizing unit for re-synthesizing the modulated colored light beams, and a projection lens unit 906 as a projecting unit for enlarging and projecting the synthesized light beams on the surface of a projection screen 100. The projection display apparatus also includes a light-guide system 927 for guiding blue light beams B to the associated light valve 925B.

The uniform illumination optical system 923 includes two lens plates 921 and 922, and a reflective mirror 931. The two lens plates 921 and 922 are disposed perpendicular to each other and opposing each other with the reflective mirror 931 therebetween. Each of the two lens plates 921 and 922 of the uniform illumination optical system 923 includes a plurality of rectangular lenses formed in a matrix. Light beams emitted by the light source device 920 are split into a plurality of light beam units by the rectangular lenses of the first lens plate 921. The light beam units are overlapped in the vicinity of the three light valves 925R, 925G, and 925B by the rectangular lenses of the second lens plate 922. By using the uniform illumination optical system 923, the three light valves 925R, 925G, and 925B can be illuminated with uniform illumination when the light beams from the light source device 920 have uneven luminosity distribution at a cross-section of the light beams.

The color separation optical system 924 includes a blue-green-reflective dichroic mirror 941, a green-reflective dichroic mirror 942, and a reflective mirror 943. Blue light beams B and green light beams G included in the light W are reflected at a right angle by the blue-green-reflective dichroic mirror 941, and led toward the green-reflective dichroic mirror 942. Red light beams R pass through the mirror 941, and are reflected at a right angle by the reflective mirror 943 disposed beyond the mirror 941, and emitted toward the synthesizing prism 910 by an emitting unit 944 for the red light beams R.

The green light beams G included in the blue and green light beams B and G which are reflected by the blue-green-reflective dichroic mirror 941 are reflected at a right angle by the green-reflective dichroic mirror 942, and are emitted toward the color synthesizing prism 910 by an emitting unit 945 for the green light beams G. The blue light beams B transmitted by the green-reflective dichroic mirror 942 are emitted toward the light-guide system 927 by an emitting unit 946 for the blue light beams B. According to this exemplary embodiment, the distances between an emitting unit of the uniform illumination optical system 923 for the light beams W and each of the emitting units 944, 945, and 946 of the color separation optical system 924 for each colored light beams are set to be substantially the same.

Condenser lenses 951 and 952 are disposed at the emission sides of the emitting units 944 and 945 of the color separation optical system 924 for the red and green light beams R and G. The red and green light beams R and G emitted by the associated emitting units are applied to the condenser lenses 951 and 952, and are collimated.

The red and green light beams thus collimated are applied to the light valves 925R and 925G, respectively, are modulated thereby, and are added with image data corresponding to each colored light. These light valves are switch-controlled according to image data by a driving unit (not shown), whereby the colored light beams transmitted thereby are modulated. The blue light beams B are led to the light valve 925B through the light-guide system 927, and are modulated according to image data by the light valve 925B in the same manner as in the other colors. The light valves 925R, 925G, and 925B according to the embodiment are liquid crystal light valves which include incident-side polarizing units 960R, 960G, and 960B, respectively, emission-side polarizing units 961R, 961G, and 961B, respectively, and liquid crystal devices 962R, 962G, and 962B, respectively. The liquid crystal devices 962R, 962G, and 962B are disposed between the incident-side polarizing units 960R, 960G, and 960B and the emission-side polarizing units 961R, 961G, and 961B, respectively.

The light-guide system 927 includes a condenser lens 954 disposed at the emission-side of the emitting unit 946 for the blue light beams B, an incident-side reflective mirror 971, an emission-side reflective mirror 972, an intermediate lens 973 disposed between the incident-side reflective mirror 971 and the emission-side reflective mirror 972, and a condenser lens 953 disposed at the incident side of the light valve 925B. The blue light beams B emitted by the condenser lens 946 are conducted through the light-guide system 927 to the liquid crystal device 962B and are modulated thereby.

The light path of the blue light beams B is the longest among the light paths of the three colored light beams between the emitting unit for the light W and the liquid crystal devices 962R, 962G, and 962B, respectively. Therefore, the loss of the amount of light of the blue light beams B is the greatest. However, the loss of the amount of light can be suppressed by providing the light-guide system 927.

The colored light beams R, G, and B modulated by the light valves 925R, 925G, and 925B, respectively, are applied to the color synthesizing prism 910, and synthesized thereby. The light beams synthesized by the color synthesizing prism 910 are enlarged and projected by the projection lens unit 906 on the surface of the projection screen 100 disposed at a predetermined position.

According to this exemplary embodiment, the liquid crystal devices 962R, 962G, and 962B may be provided with light-shielding films disposed under the TFTs. Therefore, the channels of the TFTs for switching the pixel electrodes may be sufficiently shielded from the backlight. In particular, the channels may be shielded when the light emitted by the liquid crystal devices 962R, 962G, and 962B and reflected by the projection optical system in the liquid crystal projector, the reflected light from the surface of the TFT-array substrate when the emitted light is transmitted, a part of the emitted light from the other liquid crystal devices passing through the projection optical system, and the like are applied to the TFT-array substrate side as back light.

With this arrangement, the apparatus offers at least an advantage in which it is not necessary to dispose additional films for preventing the back light between the liquid crystal devices 962R, 962G, and 962B and the color synthesizing prism 910, and to provide the polarizing units with light-preventing media, thereby reducing the apparatus in size and simplifying the configuration thereof.

According to the embodiment, since the effect of the back light on the channel regions of the TFTs can be suppressed, it is not necessary to adhere the back-light-prevention-treated polarizing units 961R, 961G, and 961B directly to the liquid crystal devices 962R, 962G and 962B. As shown in FIG. 8, the polarizing units can be disposed away from the liquid crystal devices 962R, 962G and 962B, more particularly, the polarizing units 961R, 961G, and 961B can be bonded to the color prism synthesizing 910 and the other polarizing units 960R, 960G, and 960B can be bonded to the condenser lenses 944, 945, and 953, respectively. By bonding the polarizing units to the prism unit and the condenser lenses, the heat in the polarizing units is absorbed by the prism unit and the condenser lenses, thereby suppressing temperature rise in the liquid crystal devices.

By disposing the liquid crystal devices and the polarizing units separated from each other, cool air or the like can be led between the liquid crystal devices and the polarizing units by a cooling unit (not shown), thereby further suppressing temperature rise in the liquid crystal devices, whereby malfunction of the apparatus due to temperature rise in the liquid crystal devices can be avoided.

Although the embodiment is described above by using the liquid crystal device as an example, the present invention is not limited to this embodiment, and it is applicable to electro-optical devices, such as electroluminescent devices and plasma displays.

What is claimed is:

1. An electro-optical device, comprising:
   a substrate;
   a scanning line provided on the substrate and extending in a scanning line direction;
   a data line extending in a data line direction crossing the scanning line direction;
   a pixel electrode; and
   a transistor connected to the scanning line, the data line, and the pixel electrode, the transistor including:
      a semiconductor region including a channel region having at least one end in the scanning line direction electrically connected to the data line; and
      a portion of the scanning line having a first and a second end at opposite ends of the portion in the scanning line direction and a third and a fourth end at opposite ends of the portion in the data line direction, both of the first and second ends being at least partially disposed within the semiconductor region, both of the third and the fourth ends having portions that extend outside of the semiconductor region on either side of a portion disposed within the semiconductor region, wherein
      the third end has a fifth portion disposed within the semiconductor region connecting the portions of the third end that extends outside of the semiconductor region; and
      the fourth end has a sixth portion disposed within the semiconductor region connecting the portions of the fourth end that extends outside of the semiconductor region.

2. The electro-optical device according to claim 1, the semiconductor region of the transistor including monocrystalline silicon.

3. The electro-optical device according to claim 1, the semiconductor region of the transistor including polycrystalline silicon.

4. The electro-optical device according to claim 1, the substrate being formed from an insulating material.

5. The electro-optical device according to claim 1, the substrate being a quartz substrate.

6. The electro-optical device according to claim 1, the substrate being a first substrate provided with a semiconductor layer, and further comprising:
   a second substrate disposed opposing a surface of the first substrate; and
   liquid crystals sandwiched by the first substrate and the second substrate and driven by transistor elements formed on the semiconductor layer.

7. The electro-optical device according to claim 1, the substrate being a glass substrate.

8. An electronic device, comprising:
a light source that emits light;
the electro-optical device according to claim 7 that receives light emitted by the light source and modulates the received light in accordance with image information; and
a projection system that projects the light modulated by the electro-optical device.

* * * * *